(12) United States Patent
Parat et al.

(10) Patent No.: US 8,514,624 B2
(45) Date of Patent: Aug. 20, 2013

(54) IN-FIELD BLOCK RETIRING

(75) Inventors: Krishna K. Parat, Palo Alto, CA (US); Akira Goda, Boise, ID (US); Koichi Kawai, Kanagawa (JP); Brian J. Soderling, Eagle, ID (US); Jeremy Binfet, Boise, ID (US); Arnaud A. Furnemont, Boise, ID (US); Tejas Krishnamohan, Mountain View, CA (US); Tyson M. Stichka, Boise, ID (US); Giuseppina Puzzilli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 13/165,416

(22) Filed: Jun. 21, 2011

(65) Prior Publication Data

US 2012/0327713 A1 Dec. 27, 2012

(51) Int. Cl.
*G11C 16/04* (2006.01)

(52) U.S. Cl.
USPC ............. 365/185.17; 365/185.22; 365/185.29

(58) Field of Classification Search
USPC ............. 365/185.17, 185.18, 185.22, 185.23, 365/185.25, 185.2, 185.29, 185.11, 185.15
See application file for complete search history.

(56) References Cited

U.S. PATENT DOCUMENTS

| 7,508,715 | B2 | 3/2009 | Lee | |
|---|---|---|---|---|
| 7,508,720 | B2 | 3/2009 | Tran et al. | |
| 7,542,336 | B2 | 6/2009 | Han | |
| 7,573,752 | B2 | 8/2009 | Aritome | |
| 7,577,036 | B2 | 8/2009 | Sarin et al. | |
| 7,606,079 | B2 * | 10/2009 | Sekar et al. | 365/185.22 |
| 7,643,343 | B2 | 1/2010 | Roohparvar | |
| 7,715,239 | B2 | 5/2010 | Aritome | |
| 7,724,577 | B2 | 5/2010 | Goda et al. | |
| 7,738,292 | B2 | 6/2010 | Radke | |
| 7,746,700 | B2 | 6/2010 | Roohparvar | |
| 7,782,677 | B2 | 8/2010 | Roohparvar | |
| 7,855,927 | B2 | 12/2010 | Han | |
| 7,864,585 | B2 | 1/2011 | Tamada | |
| 7,867,844 | B2 | 1/2011 | Hu | |
| 8,004,900 | B2 * | 8/2011 | Dutta et al. | 365/185.19 |
| 2008/0266975 | A1 * | 10/2008 | Sekar et al. | 365/185.23 |
| 2009/0080263 | A1 * | 3/2009 | Lee et al. | 365/185.19 |
| 2009/0303799 | A1 | 12/2009 | Nakamura | |
| 2010/0238730 | A1 * | 9/2010 | Dutta et al. | 365/185.17 |

\* cited by examiner

*Primary Examiner* — Gene Auduong
(74) *Attorney, Agent, or Firm* — Schwegman, Lundberg & Woessner, P.A.

(57) ABSTRACT

Memory devices and methods are disclosed, including a method involving erasing a block of memory cells. After erasing the block, and before subsequent programming of the block, a number of bad strings in the block are determined based on charge accumulation on select gate transistors. The block is retired from use if the number of bad strings exceeds a threshold. Additional embodiments are disclosed.

29 Claims, 9 Drawing Sheets

IN-FIELD BLOCK RETIRING

BACKGROUND

Flash memory stores information in an array of transistors, called "cells," each of which stores one or more bits (or portions of bits) of information. NOR flash and NAND flash are two current types of flash memory devices. NOR and NAND refer to the type of logic used in the storage cell array. Flash memory is non-volatile, which means that it stores information in a way that does not need power to maintain the stored information.

A flash memory cell includes a control gate (CG), as in other MOS (metal oxide semiconductor) transistors, but also includes a charge storage structure, such as a floating gate (FG) or charge trap (CT), that is insulated by an oxide or other dielectric. The charge storage structure is located between the CG and semiconductor material and stores electrons or holes placed on it. Information is represented by the stored electrons or holes.

NAND array architecture arranges its array of memory cells in a matrix such that the control gates of each memory cell of the array are coupled in rows to access lines, which are conventionally referred to as word lines. The memory cells of the array are coupled together in series, source to drain, between a source line and the data line. Memory cells in a NAND array architecture can be programmed to a desired state. That is, electric charge can be accumulated (e.g., placed) on, or removed from, the floating gate of a memory cell to put the cell into a number of stored states. For example, a single level cell (SLC) can represent two binary states, e.g., 1 or 0. Multi state memory cells, multibit cells, or multilevel cells (MLCs) can store more than two states.

When electrons are trapped on the FG, they modify the threshold voltage (Vt) of the cell. Thus, when the cell is "read" by placing a specific voltage on the CG, electrical current will either flow or not flow between the cell's source and drain connections, depending on the Vt of the cell. This presence or absence of current can be sensed and translated into 1's and 0's, reproducing the stored data.

BRIEF DESCRIPTION OF THE DRAWINGS

Embodiments of the invention are illustrated by way of example and not limitation in the figures of the accompanying drawings in which.

DETAILED DESCRIPTION

The following detailed description refers to the accompanying drawings that show, by way of illustration, and not limitation, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Figure 1:
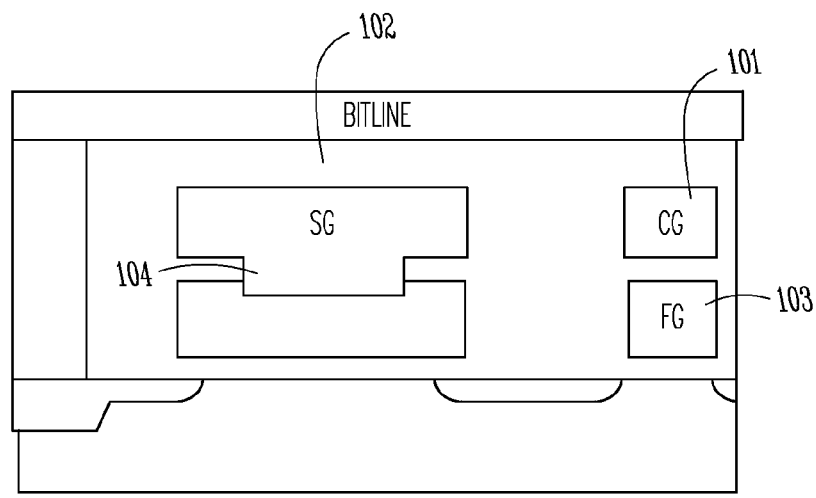
FIG. 1 shows a memory cell and select gate according to prior art NAND technology.

FIG. 1 shows the memory cell 101 and select gate 102 according to prior art NAND technology. The memory cell 101 uses a thick (50-100 nm by way of example) FG 103 for the charge storage. In the select gate region, the CG is shorted by region 104 to FG 103.

Figure 2:
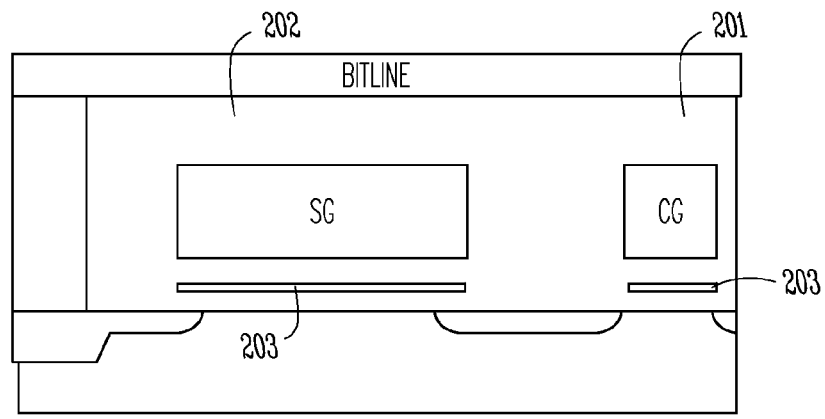
FIG. 2 shows an expected structure of a memory cell and select gate, according to an embodiment of the invention.

The memory cell structure may change as NAND technology continues to progress to provide smaller devices. For example, it is expected that a conventional FG wrap cell will change to a planar/charge-trap cell as NAND technology scales below the 25 nm node. A consequence of this change is that the select gate (SG) also ends up with a charge trapping layer in its gate stack. FIG. 2 shows a memory cell 201 and select gate 202, according to an embodiment of the invention. The illustrated memory cell 201 uses a thin (5 nm by way of example) charge storage material 203 for charge storage. It may not be possible to form a contact to this material to electrically short material 203 because of the reduced dimension of the material 203. Additionally, this material may be non-conductive. As a result this thin and sometimes non-conductive charge storage material 203 remains in the gate stack of the select gate 202, and can capture or emit electrons during the program/erase/read operation of the NAND array. This can cause the threshold voltage (Vt) of the select gate to shift, and fatal data errors may occur if the Vt shift becomes large enough. This is illustrated in more detail below with respect to FIG. 3.

Figure 3:
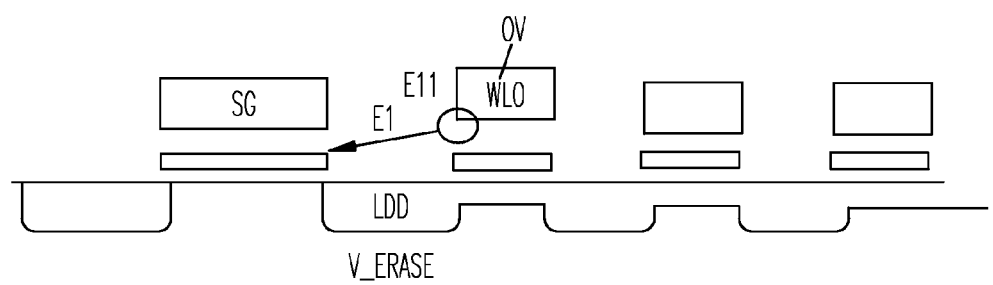
FIG. 3 illustrates the electric fields that may affect performance of a memory device, according to an embodiment of the invention.

During an erase operation, for example, the substrate or well is biased with a high positive voltage, the access lines are grounded, and the select gates are de-biased. Access lines are conventionally referred to in the art as "word" lines. Word lines may be used herein as an example of an access line. FIG. 3 illustrates the electric fields E1, E11 that may affect performance of a memory device. A high field E1 develops between the edge cells (corresponding to WL0) and the select gate (SG). If repeated program and erase cycles cause high enough stress, electrons are progressively injected from the corner of the edge cells due to high corner electric field (E11) and can be trapped either above the source drain (LDD) area or in the gate stack of the select transistor (SG) due to high lateral electric field (E1). If a sufficient number of electrons are trapped above the LDD area, the resistance of the NAND string increases. The read operation and the reliability of the NAND flash array may be adversely affected by increasingly large resistances. The electrons trapped in the select gate stack increase the select gate threshold voltage (Vt), which progressively shuts off the select gate and the entire NAND string.

Thus, trapped electrons in the gate stack of select transistors can affect the reliability of the NAND flash array. Various embodiments of the invention check (e.g. test) the Vt of the select gate and the adjacent cell, also referred to as an edge cell (being at the edge of the array), at the end of an erase operation to assure that it is within a prescribed (e.g., acceptable) Vt range.

Figure 4:
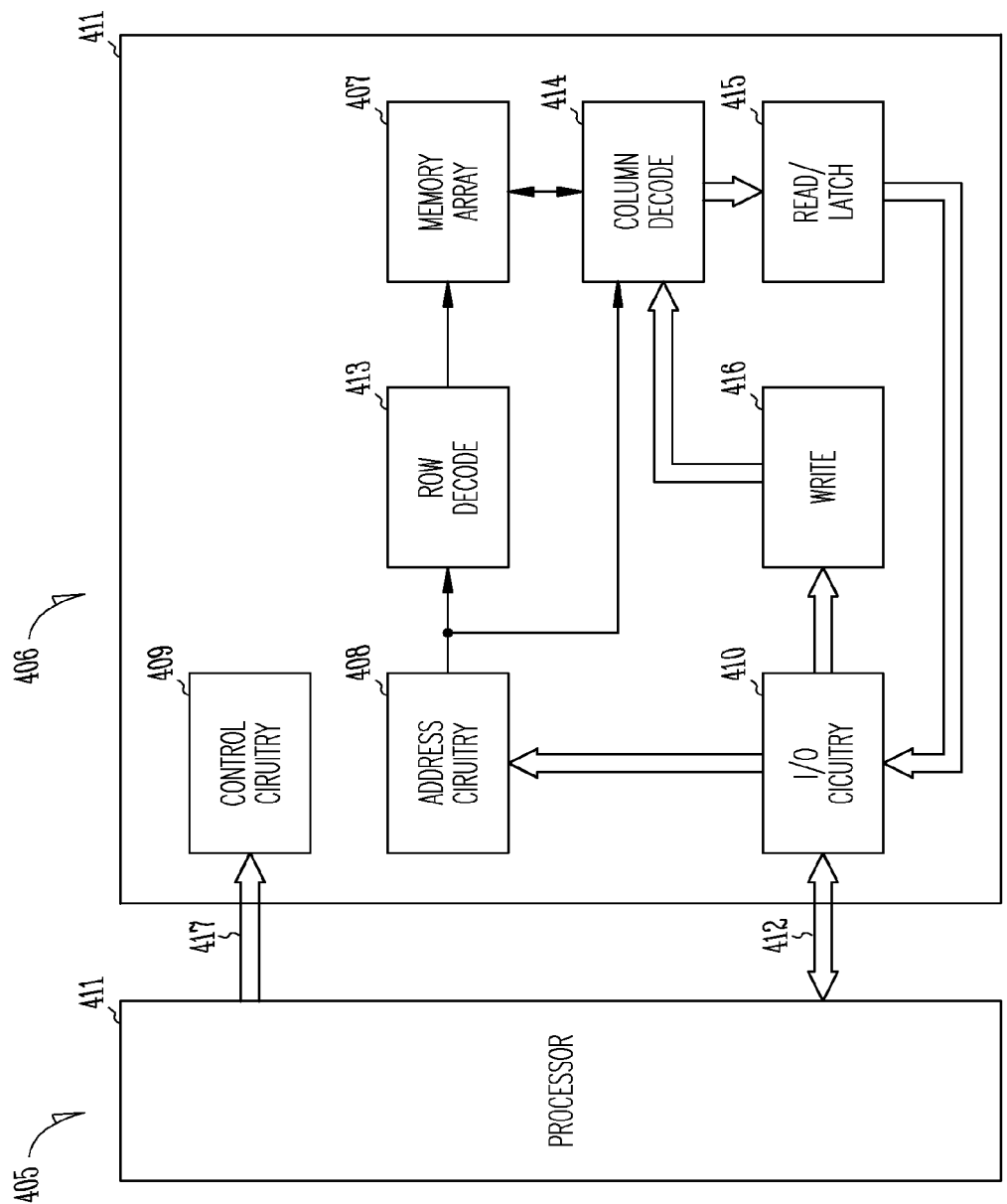
FIG. 4 is a simplified block diagram of memory system that includes an integrated circuit memory device, according to an embodiment of the invention.

FIG. 4 is a simplified block diagram of memory system 405 that includes an integrated circuit memory device 406, according to an embodiment of the invention. The memory device 406 includes an array of charge storage memory cells 407, address circuitry 408, a controller (e.g., control circuitry and/or firmware) 409, and Input/Output (I/O) circuitry 410. The memory cells are sometimes also referred to as Flash memory cells because blocks of memory cells are typically erased substantially concurrently, in a 'flash' operation.

A memory access device, such as processor 411, is coupled to device 406. The illustrated memory system 405 can include separate integrated circuits or both the processor 411 and the memory device 406 can be formed as part of the same integrated circuit. The processor 411 can be a microprocessor or some other type of controlling circuitry such as an application-specific integrated circuit (ASIC). The processor 411 can be a processor of an external host device, e.g., a digital camera, digital recording and playback device, PDA, personal computer, memory card reader, interface hub, and the like.

The illustrated embodiment of FIG. 4 includes address circuitry 408 to latch address signals provided over I/O connections 412 through I/O circuitry 410. Address signals are received and decoded by a row decoder 413 and a column decoder 414 to access the memory array 407. The memory device 406 can read data in the memory array 407 by sensing voltage and/or current changes in the memory array columns using sense/buffer circuitry that can be read/latch circuitry 415 configured to read and latch a row or sector of data from the memory array 407. Write circuitry 416 is configured to write data to the memory array 407.

Controller 409 decodes signals provided by control connections 417 from the processor 411. These signals can include chip enable/select signals, write enable signals, and address latch signals that are used to control the operations on the memory array 407, including data read, data write, and data erase operations. In various embodiments, the controller 409 is responsible for executing instructions from the processor 411 to perform verification process, including threshold voltage monitoring, after an erase cycle.

The memory system 406 has been simplified to focus on features with particular relevance to the present disclosure. Memory array types may include NAND, NOR, AND and other memory array architecture. A specific example of checking threshold voltages for a string of memory cells after an erase cycle for NAND memories is discussed herein, where memory blocks are retired if a number of "bad" strings exceeds a threshold. However, such processes may also be useful for other types of memory.

Figure 5:
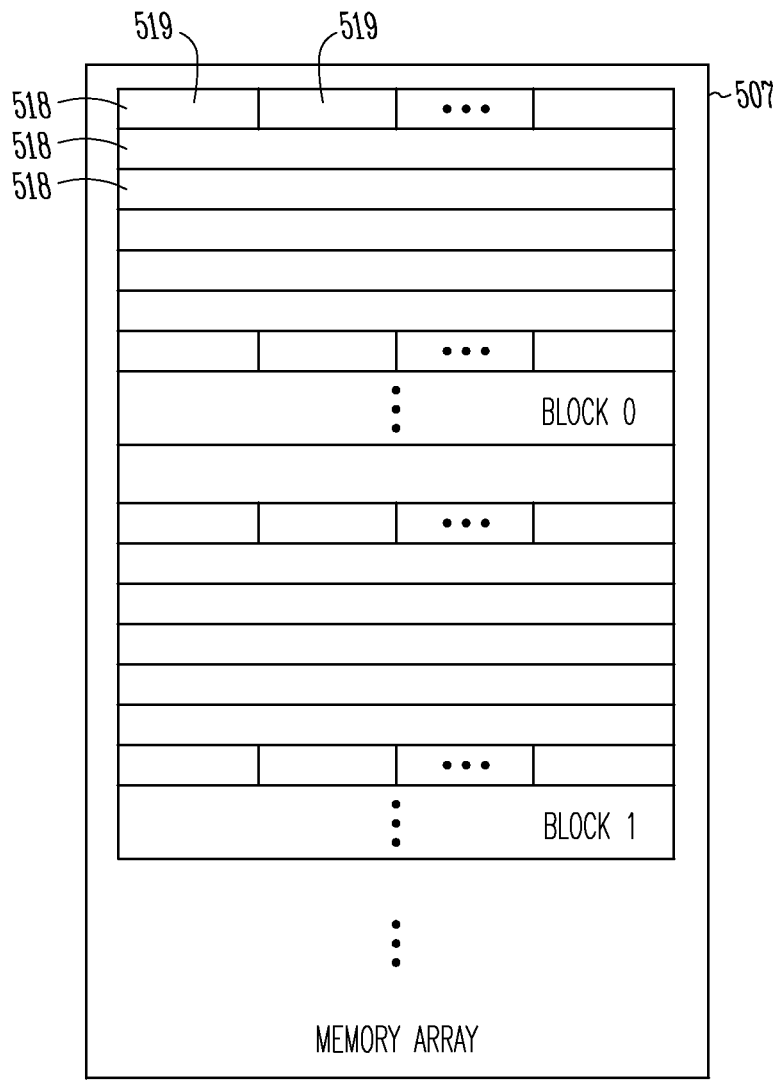
FIG. 5 illustrates an embodiment of a memory array, such as the array illustrated in the memory device of FIG. 4.

FIG. 5 illustrates an embodiment of a memory array 507, such as the array 407 illustrated in the memory device 406 of FIG. 4. The memory array 507 contains charge storage memory cells arranged in a sequence of memory blocks (BLOCK 0), (BLOCK 1), etc. As an example, the number of memory blocks in the memory array may be 128 blocks, 512 blocks, or 1,024 blocks. The present subject matter is not limited to a particular number of memory blocks in an array. The blocks may be referred to as erase blocks, since in a flash memory device the memory cells in each block can be erased at substantially the same time. Each memory block contains a number of physical rows 518 of memory cells. The number of cells per physical row 518 corresponds to the number of columns, e.g., data lines. A data line can also be referred to as a bit line or a sense line, in some embodiments. In some embodiments, the cells in each row 518 are associated with an even or an odd data line.

In various embodiments, the rows 518 contain one or more logical sectors 519. Each logical sector 519 can store a number of bytes of data. In operation, the memory cells in each logical sector 519 can be selected to be simultaneously written to and/or read from as a group. The memory cells in each logical sector 519 can have a number of associated logical pages. The logical pages can correspond to the number of binary bits stored in each cell and can be separately addressed, which can allow for the logical pages of the cells to be programmed and/or read at different times.

Figure 6:
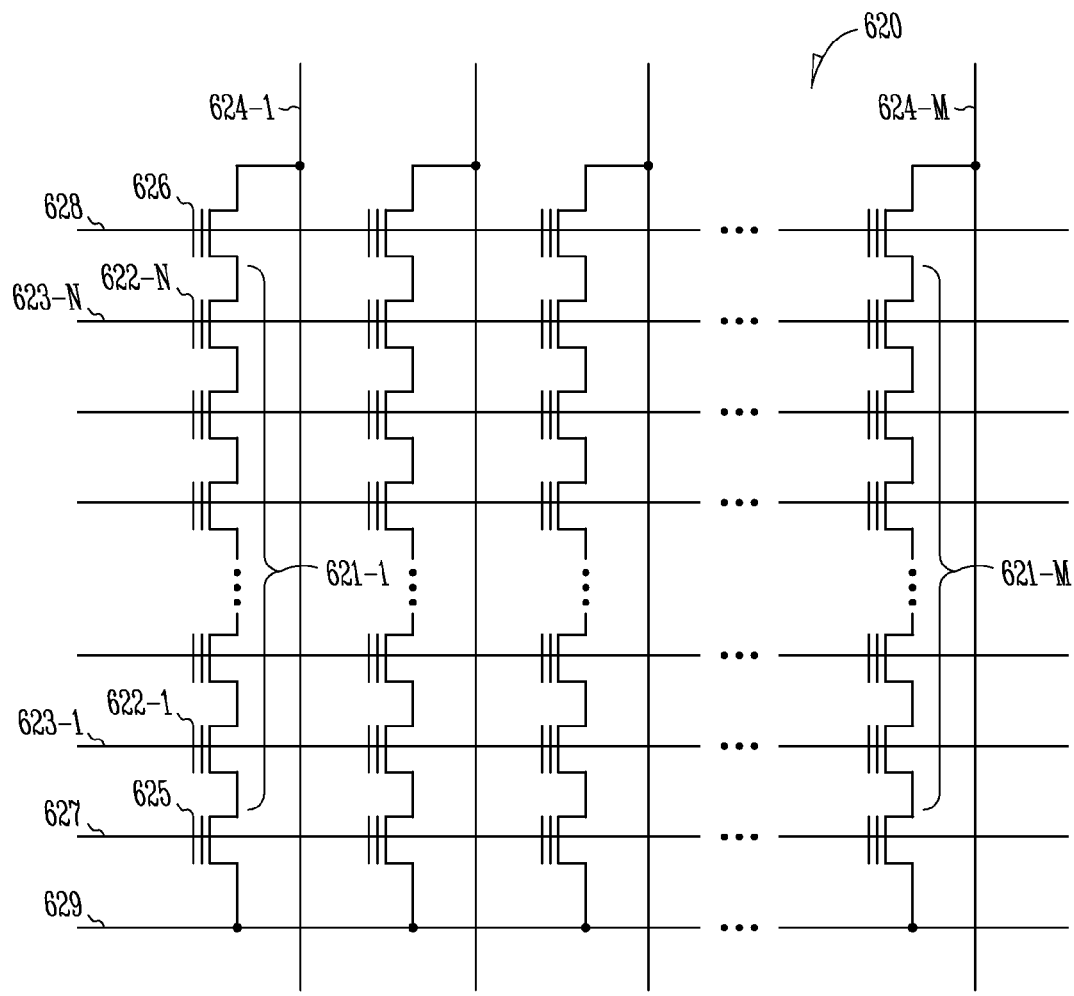
FIG. 6 illustrates an embodiment of a NAND memory array.

FIG. 6 illustrates an embodiment of a NAND memory array 620, which includes NAND strings 621-1, ..., 621-M. Each NAND string includes non-volatile memory cells 622-1, ..., 622-N. The non-volatile memory cells 622-1, ..., 622-N of each NAND string 621-1, ..., 621-M are connected in series source to drain between a source select gate (SGS) transistor 625, and a drain select gate (SGD) transistor 626. A source of source select gate 625 is connected to a common source line 629. The drain of source select gate 625 is connected to the source of the memory cell 622-1 of the corresponding NAND string 621-1. The drain of drain select gate 626 is connected to the local data line 624-1 for the corresponding NAND string 621-1. The source of drain select gate 626 is connected to the drain of the last memory cell 622-N, e.g., a charge storage transistor, of the corresponding NAND string 621-1.

Non-volatile memory cells, 622-1, ..., 622-N, have their control gates coupled to access lines, 623-1, ..., 623-N respectively. An AND array architecture would be similarly laid out, except that the string of memory cells would be coupled in parallel between the select gates.

NAND Flash typically uses electron tunnel or electron injection for writing, and tunnel release for erasing. In a read operation, an access line of a target (selected) memory cell can be adjusted to particular voltage levels for sensing (e.g., reading or verifying) the cells. All unselected cell access lines are coupled to a voltage sufficiently high to activate the unselected cells regardless of the charge stored on their charge storage structures. Depending upon the programmed state of the selected cell, the access line may activate the selected cell.

Memory cells have been used to store one data bit in a binary manner, as either a first or second data state. A logic one value may be stored as a charge on a memory cell and a logic zero value may be represented by a discharged memory cell. To increase data storage capacity, multiple level memory cells (MLCs) have been developed to allow for storage of multiple data bits. As such, a two-state memory cell stores one bit of data and a four state memory cell is used to store two bits of data. Thus, a memory cell with $2^x$ states stores X bits of data.

For ease of addressing in the digital environment, the number of access lines 205-1, ..., 205-N and the number of data lines that function to store data in the memory array can be formed according to some power of two. Some embodiments provide additional access lines and cells that function as "dummy" access lines and "dummy" cells which do not function to store data in the memory array. In a sixty-four access line example, sixty-four is a power of two. However, one or more dummy access lines may be positioned between the functional access lines and the select gates. Thus, by way of example, 68 access lines may be used to provide a memory array that functionally stores data with 64 access lines. In this example, WL2-WL65 can be used to store data within the array, and WL0-WL1 and WL66-67 may be dummy lines. As will be described in more detail below, various embodiments of the invention use the dummy access lines and dummy cells during erase operations to protect the select gates from accumulating electrons.

Figure 7:
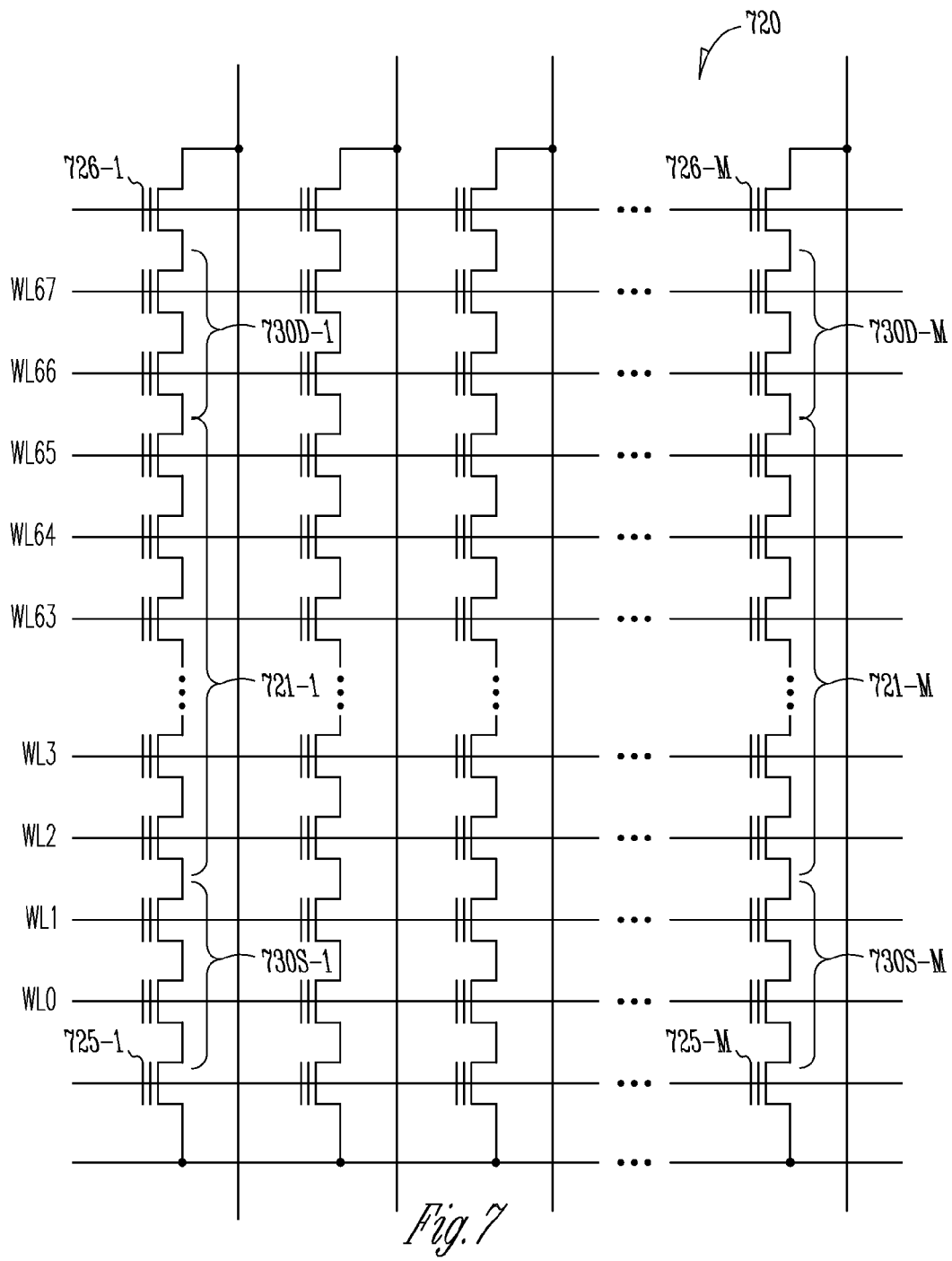
FIG. 7 illustrates an embodiment of a NAND memory array with dummy access line.

FIG. 7 illustrates an embodiment of a NAND memory array 720, which includes NAND strings 721-1, ..., 721-M and dummy access line(s) 730D-1, ... 730D-M, and 703S-1, 730S-M, connected in series (source to drain) between source select gate (SGS) transistors 725-1, ..., 725-M, and a drain select gate (SGD) transistor 726-1, ..., 726-M. In an example with NAND strings that include 64 memory cells, the number of access lines (and therefore rows) is sixty-eight if two dummy access lines are positioned on each edge of the array. The access lines may be labeled WL0-WL67, where WL0, WL1, WL66 and WL67 are dummy access lines. Dummy access line WL0 is an edge access line and dummy access line WL67 is an edge access line. The present subject matter is not limited to a particular number of access lines.

Various embodiments check the threshold voltages of the select gates (SGD and SGS) and the two cells (referred to as edge cells) adjacent to the select gates at the end of block erase. If the Vt is outside of a particular range (e.g., window), that block is marked as a bad block and is retired from being used. By checking thresholds to catch potential select gate problems, memory blocks can be retired before they provide fatal read errors.

During program/erase/read operations, the charge storage material) in the select gate can end up losing electrons or accumulating (e.g., gaining) electrons. As an example, during a read operation of the NAND cells, the select gates of the selected block may be biased to a positive voltage which can cause electrons to tunnel from the source/drain channel into the charge storage material, causing the threshold voltage of the select gate (SG Vt) to increase. During the same bias operation, the electrons can tunnel out of the charge storage material into the gate, which can cause the SG Vt to decrease. Similarly, during the programming operation, with the data lines and source at a logic high level, and the select gates of the deselected blocks held at a logic low level, electrons can tunnel out of the charge storage material. During an erase operation, there could be injection of electrons from the edge cell into the select gate, causing the SG Vt to increase.

To operate properly, the SG Vts should be maintained within a prescribed range. If the SG Vts are high, the data line biases may not be passed into the strings of the selected block resulting in failure of program and read operations. If the SG Vts become too low, the data line biases can get passed onto the strings of the de-selected block causing excess data line leakage and failure of read operations.

Figure 8:
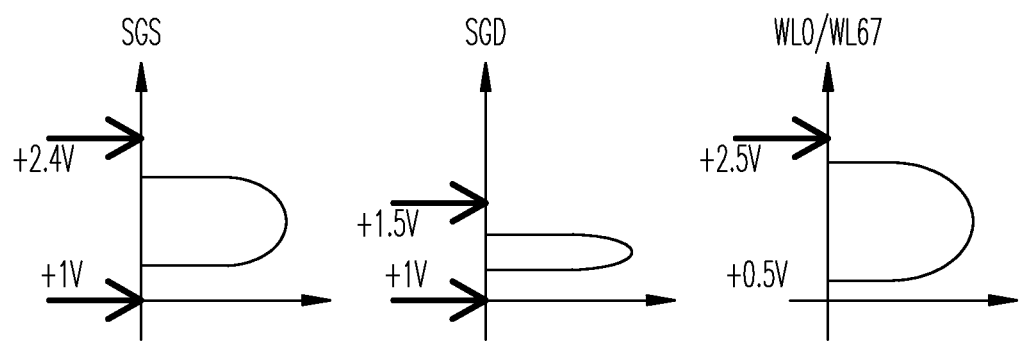
FIG. 8 illustrates the prescribed Vt ranges for the source select gate (SGS), the drain select gate (SGD), and for the dummy cells (e.g. the cells corresponding to dummy access lines WL0 and WL67) for an embodiment of a NAND memory array.

FIG. 8 illustrates the prescribed Vt ranges for the source select gate (SGS), the drain select gate (SGD), and for the edge cells (e.g. dummy cells WL0 and WL67) for an embodiment of a NAND memory array. In the illustrated example, the Vt distribution for the SGS is between about 1V (lower edge of acceptable distribution, also referred to as a lower threshold distribution edge) and about 2.4V (upper edge of acceptable distribution, also referred to as an upper threshold distribution edge), the Vt distribution for the SGD is between about 1V (lower edge of acceptable distribution) and about 1.5V (upper edge of acceptable distribution), and the Vt distribution for the edge cells (WL0/WL67) is between about 0.5V (lower edge of acceptable distribution) and about 2.5V (upper edge of acceptable distribution).

Figure 9:
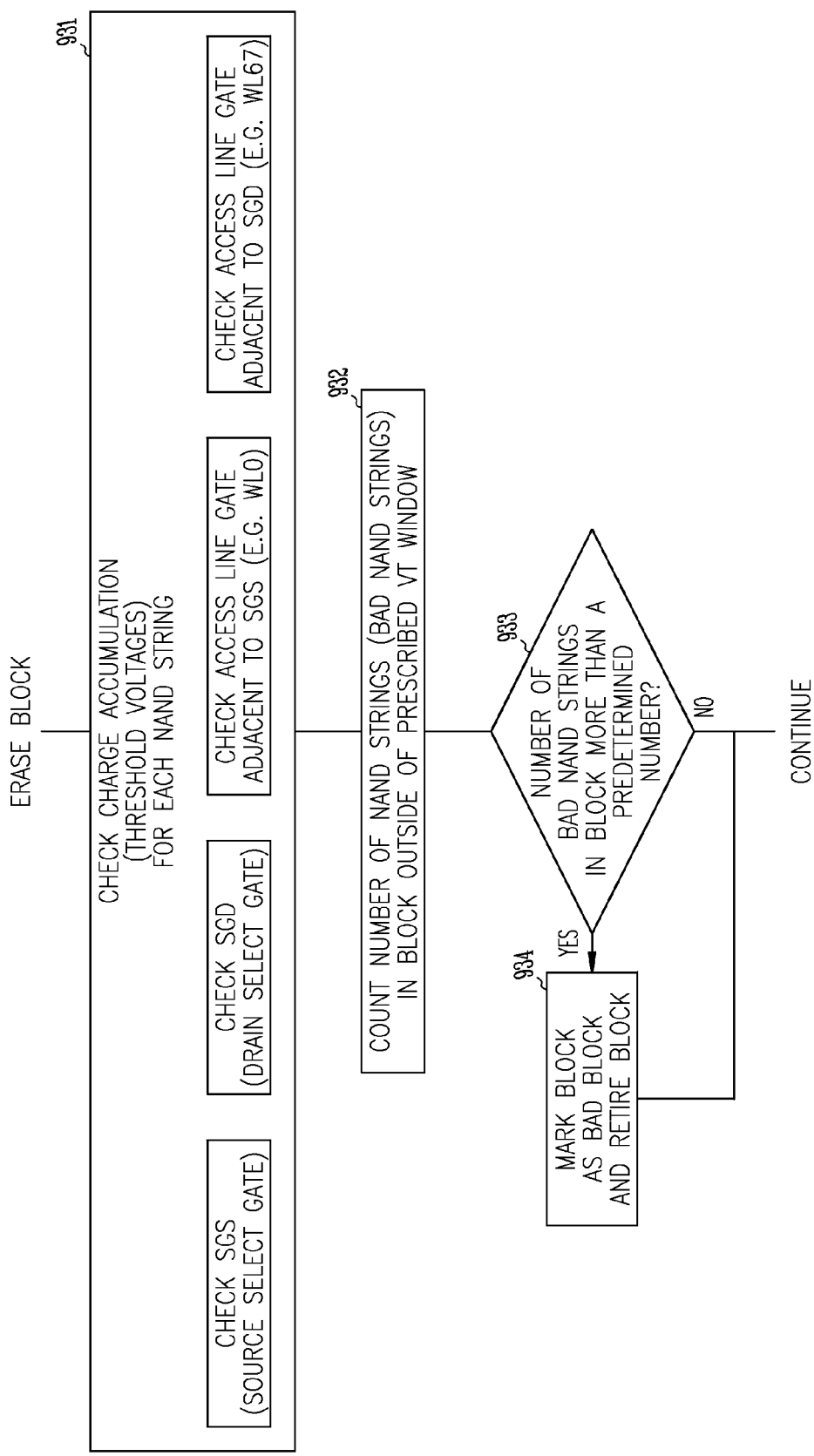
FIGS. 9-10 illustrate embodiments of a method for verifying the memory block after a block erase operation.

FIG. 9 illustrates an embodiment of a method for verifying the integrity of the memory block after a block erase operation. In particular, each NAND string is checked for excessive charge accumulation that is attributable to the erase block routine. At block 931, the threshold voltages for the select gates and the edge access line gates are checked after the erase function. As illustrated, threshold voltages of the SGS, SGD, WL0 and WL67 are checked (e.g., tested) after the erase function. The results of checking the threshold voltages can be recorded, such as in a cache memory, and the recorded results can be evaluated later. WL0 and WL67 are dummy cells in this example. However the present subject matter is not limited to embodiments with arrays that have dummy cells, as other embodiments might be implemented with arrays that do not use dummy cells.

The threshold voltages of these gates can be checked by sensing (e.g., verifying) each of these gates and counting the number of failures. Different trims (gate potentials) can be used to verify against the lower limit SG VT (select gate threshold voltage) and the higher limit SG VT. For example, a select gate can be checked to determine if it has a VT less than 1 V by placing a 1 V potential at the gate, and determining if current flows through the transistor. The potential applied to the gate for the threshold voltage check may be referred to as a test potential, as it tests whether the transistor conducts when that potential is applied to the gate. For the edge cells (e.g. WL0/WL67), it may be useful to check for the upper limit of the prescribed VT range. If the VT of these transistors is outside of the prescribed range for those cells, then the NAND string is determined to be "bad". The bad NAND strings for the block are counted at block 932. At block 933, the number of counted bad NAND strings is compared to a threshold (e.g., a particular number) of allowable bad NAND strings for the block.

NAND memory devices are still able to use blocks with a number of bad NAND strings. For example, NAND memory devices may use error correction codes (ECCs). If the number of counted bad NAND strings exceeds the threshold, the block is marked as "bad" and is retired from being used within the array, as generally illustrated at block 934.

NAND memory manufacturers can test memories and mark bad blocks. However, this "bad block" testing conventionally occurs after fabrication and before distribution. In contrast, various embodiments can operate to check the Vts in-field, during the course of memory operation (e.g. after block erase activity), and can be configured to retire memory blocks if too many of the NAND strings within the block have had their Vts drift to unacceptable values, such as would adversely affect the operation of the memory (e.g. the Vt has drifted outside of the manufacturer's specified acceptable values).

Figure 10:
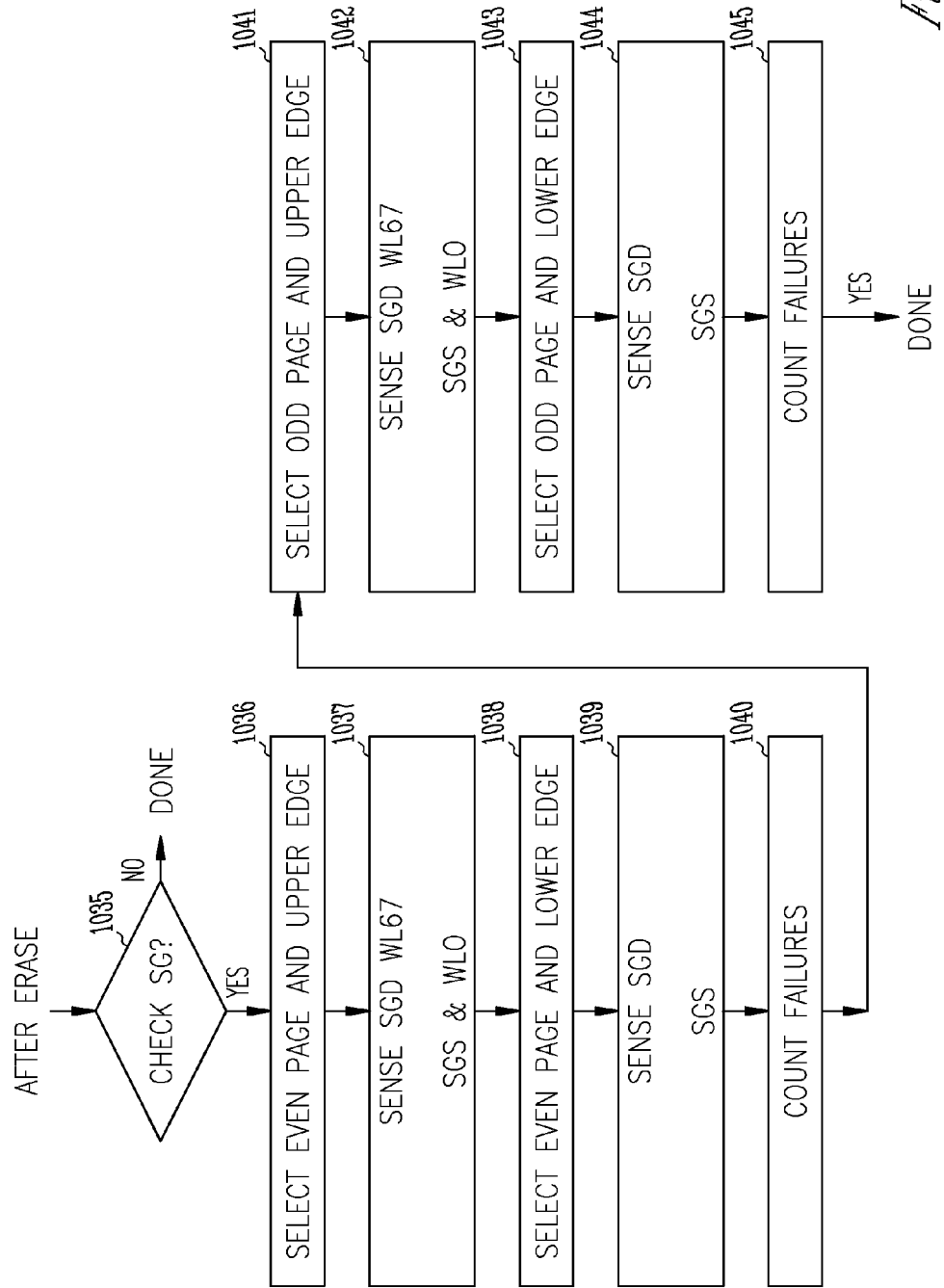

FIG. 10 illustrates an embodiment of a method for verifying the integrity of the memory block after a block erase operation. After a block erase operation and before subsequent programming of the block, the illustrated process determines if the threshold voltages should be checked 1035. If the threshold voltages are to be checked, the process selects a page and a threshold distribution edge to check. For example, at block 1036, the illustrated process describes selection to evaluate the thresholds for even page and upper edge. At block 1037, the illustrated process describes sensing the drain select gate, sensing the edge cell adjacent to the drain select gate, sensing the source select gate, and sensing the edge cell adjacent to the source select gate. The illustrated process proceeds to describe evaluating the even page and lower edge at block 1038, and sensing the drain select gate and the source select gate at block 1039. The process proceeds to describe evaluating the odd page and upper edge at block 1040. At block 1041, the illustrated process describes sensing the drain select gate, sensing the edge cell adjacent to the drain, sensing the source select gate, and sensing the edge cell adjacent to the source. At block 1042, the illustrated process proceeds to describe evaluating the odd page and lower edge, and sensing the drain select gate, the edge cell adjacent to the drain select gate, sensing the source select gate, and sensing the edge cell adjacent to the source select gate at 1043. The value (e.g., content) of the sensed gates (e.g., whether they passed or failed verification) can be stored in a data cache. The illustrated process proceeds to describe counting the number of failures (e.g., represented by logical zeros) in the data cache, as illustrated at 1044. If the number of failures exceeds a threshold, then the process describes the provision of a fail status indicator. The threshold may be based on ECC capabilities. Typically, a fraction of the ECC budget may be used for the particular failure mechanism. By way of example and not limitation, a fail status indicator may be provided after the counted number of failures exceeds 10 to 20 failures.

Some embodiments improve the reliability of the NAND array during erase operations by appropriately biasing (or debiasing) the edge access line to reduce the electric field and hence, reduce the charge injection from the edge cells (and the subsequent trapping in the select gate stacks and above the LDD regions).

The access line and cell closest to the select gate may be a "dummy" access line and "dummy" cell, respectively, which are not used in the same way as other access lines and memory cells in the array. The memory cells connected to the dummy access lines may be referred to as dummy access line transistors. The voltage applied to this edge dummy access line can be chosen appropriately to reduce or prevent the injection and/or subsequent trapping of electrons from the edge cell into the select gate stack or above the source-drain area (LDD) during the erase operation of the NAND flash array, and hence, improve the reliability of the NAND flash array. If the edge access line is used as a dummy access line, the voltage applied during erase can be high to prevent the injection and/or subsequent trapping of electrons from the edge cell into the select gate stack or above the source-drain area (LDD). Further, this voltage is also appropriately chosen to avoid a translation of a similar problem to the edge cell and its adjacent memory cell, which will occur if electric fields are too high. Thus the dummy access lines are appropriately biased during the erase function to reduce an electric field during the erase function and charge injection from the electric field in comparison to that which would be experienced by an edge access line if dummy edge access lines are not used.

Dummy access lines are already used to prevent program disturb issues in the NAND array. However, embodiments of the present invention use this dummy access line to prevent the degradation of the NAND array storage/recall capability occurring during erase stress and cycling.

Figure 11:
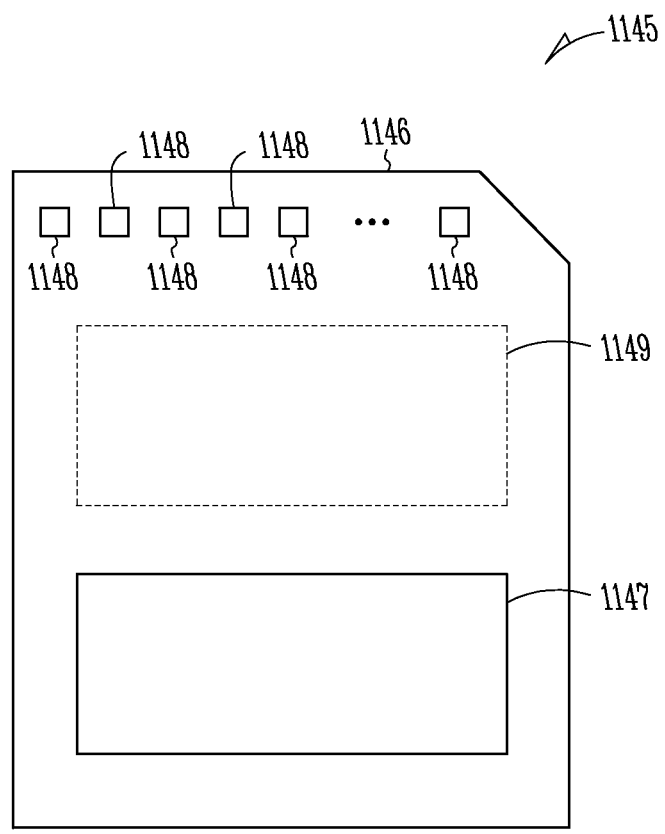
FIG. 11 is a functional block diagram of a memory module having at least one memory device in accordance with an embodiment of the invention.

FIG. 11 is a functional block diagram of a memory module having at least one memory device in accordance with an embodiment of the invention. Memory module 1145 is illustrated as a memory card, although the concepts discussed with reference to memory module are applicable to other types of removable or portable memory (e.g., USB flash drives) and are intended to be within the scope of "memory module" as used herein. The present subject matter is therefore not limited to a particular form factor.

In some embodiments, memory module 1145 include a housing 1146 to enclose one or more memory devices 1147, though such a housing is not essential to all devices or device applications. At least one memory device 1147 includes an array of non-volatile memory cells according to various embodiments described herein. Where present, the housing 1146 includes one or more contacts 1148 for communication with a host device. Examples of host devices include digital cameras, digital recording and playback devices, PDAs, personal computers, memory card readers, interface hubs and the like. The contacts 1148 may be formed according to a standardized interface, or in the form of a semi-proprietary interface found on various memory cards. In general, however, contacts 1148 provide an interface for passing control, address and/or data signals between the memory module and a host having compatible receptors for the contacts.

The memory module 1145 may include additional circuitry 1149, which may be one or more integrated circuits and/or discrete components. For some embodiments, the additional circuitry 1149 may include a memory controller for controlling access across multiple memory devices 1147 and/or for providing a translation layer between an external host and a memory device 1147. The additional circuitry 1149 may further include functionality unrelated to control of a memory device 1147, such as logic functions as might be performed by an ASIC. Also, the additional circuitry 1149 may include circuitry to restrict read or write access to the memory module, such as password protection, biometrics or the like. The additional circuitry may include circuitry to indicate a status of the memory module 1145. For example, the additional circuitry may include functionality to determine whether power is being supplied to the memory module 1145, whether the memory module 1145 is currently being accessed, and to display an indication of its status, such as a solid light while powered and a flashing light while being accessed. The additional circuitry may further include passive devices, such as decoupling capacitors to help regulate power requirements within the memory module 1145.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method, comprising:
   erasing a block of memory cells, wherein the block has a plurality of select gate transistors; and
   after erasing the block and before subsequent programming of the block:
   determining a number of bad strings in the block based on charge accumulation on the select gate transistors; and
   retiring the block from use if the number of bad strings exceeds a threshold.

2. The method of claim 1, wherein the strings in the block include a plurality of NAND strings, and for each NAND string in the block, determining a number of bad strings in the block comprises:
   checking a threshold voltage of a drain select gate transistor of the string;
   checking a threshold voltage of an edge access line transistor adjacent to the drain select gate transistor in the string;
   checking a threshold voltage of a source select gate transistor of the string;
   checking a threshold voltage of an edge access line transistor adjacent to the source select gate transistor; and
   recording results of the checking acts.

3. The method of claim 2, wherein checking a threshold voltage of a transistor comprises determining whether the threshold voltage of that transistor is within a prescribed range of threshold voltages.

4. The method of claim 2, wherein the edge access line transistors are dummy transistors that are not used to store data, and wherein erasing the block of memory cells includes biasing the dummy access line transistors to reduce an electric field and charge injection from the electric field.

5. The method of claim 1, wherein erasing the block includes biasing dummy access line transistors to reduce an electric field and charge injection from the electric field into charge storage material of the select gate transistors, wherein each of the strings comprises a dummy access line transistor connected between a memory cell of the string and a drain select gate transistor, and another dummy access line transistor connected between another memory cell of the string and a source select gate transistor.

6. The method of claim 5, wherein determining a number of bad strings includes, for each of the strings, determining if the drain select gate transistor has a threshold voltage within a first prescribed range of voltages, and determining if the source select gate transistor has a threshold voltage within a second prescribed range of voltages.

7. The method of claim 6, wherein determining a number of bad strings further includes, for each of the strings, determining if the edge access line transistors of the string have a threshold voltage within a third prescribed range of voltages.

8. The method of claim 7, wherein the first range, the second range and the third range are different.

9. A method, comprising:
erasing a block of memory cells, wherein the block has a plurality of strings of memory cells; and
after erasing the block and before subsequent programming of the block:
checking threshold voltages for each of the plurality of strings;
counting a number of the plurality of strings having a threshold voltage outside of a prescribed range; and
retiring the block from use if the number of strings exceeds a threshold.

10. The method of claim 9, wherein checking threshold voltages for each of the plurality of strings includes evaluating for a lower edge of an acceptable threshold voltage distribution and evaluating for an upper edge of an acceptable threshold voltage distribution.

11. The method of claim 9, wherein each of the plurality of strings is connected between a drain select gate transistor and a source select gate transistor, and wherein checking threshold voltages for each of the plurality of strings includes determining if the drain select gate transistor of a string has a threshold voltage within a first prescribed range of voltages, and determining if the source select gate transistor of the string has a threshold voltage within a second prescribed range of voltages.

12. The method of claim 11, wherein the second prescribed range is different from the first prescribed range.

13. The method of claim 9, wherein checking threshold voltages for each of the plurality of strings includes checking threshold voltages of edge access line transistors adjacent to select gate transistors.

14. The method of claim 9, wherein checking threshold voltages for each of the plurality of strings includes, for each of the strings:
applying a test potential to a control gate of a drain select gate transistor, wherein the test potential corresponds to an edge of an acceptable threshold voltage distribution for the drain select gate transistor; and
applying another test potential to a control gate of a source select gate transistor, wherein the other test potential corresponds to an edge of an acceptable threshold voltage distribution for the source select gate transistor.

15. A method, comprising:
erasing a block of non-volatile memory cells, wherein the block has a plurality of NAND strings of series-coupled non-volatile memory cells; and
after erasing the block and before subsequent programming of the block:
testing each of the plurality of NAND strings, wherein for each NAND string testing includes:
performing a threshold voltage test for a drain select gate transistor;
performing a threshold voltage test for a first edge access line transistor adjacent to the drain select gate transistor;
performing a threshold voltage test for a source select gate transistor;
performing a threshold voltage test for a second edge access line transistor adjacent to the source select gate transistor; and
recording test results for the threshold voltage tests;
determining a number of bad NAND strings in the block based on the test results; and
if the number of bad NAND strings exceeds a threshold, marking the block as a bad block and retiring the block from use.

16. The method of claim 15, wherein performing the threshold voltage test for the drain select transistor includes testing the drain select transistor for a desired threshold voltage between about 1V and about 1.5V.

17. The method of claim 15, wherein performing the threshold voltage test for the source select transistor includes testing the source select transistor for a desired threshold voltage between about 1V and about 2.4V.

18. The method of claim 15, wherein performing the threshold voltage test for the first edge access line transistor or the second edge access line transistor includes testing the first edge access line transistor or the second edge access line transistor for a desired threshold voltage between about 0.5V and about 2.5V.

19. A memory device, comprising:
a block of memory cells, wherein the block has a plurality of select gate transistors; and
a controller configured to:
erase the block of memory cells; and
after erasing the block and before subsequent programming of the block:
determine a number of bad strings in the block based on charge accumulation on the select gate transistors; and
retire the block from use if the number of bad strings exceeds a threshold.

20. The device of claim 19, wherein the strings in the block comprise a plurality of NAND strings, and wherein the controller being configured to determine a number of bad strings in the block comprises the controller being configured to test each of the plurality of NAND strings in the block using a process, including:
checking a threshold voltage of a drain select gate transistor;
checking a threshold voltage of an edge access line transistor adjacent to the drain select gate transistor;

checking a threshold voltage of a source select gate transistor;

checking a threshold voltage of an edge access line transistor adjacent to the source select gate transistor.

21. The device of claim 19, wherein the block of memory cells further comprises a plurality of dummy access line transistors, wherein the select gate transistors are adjacent to the dummy access line transistors.

22. The device of claim 21, wherein in erasing the block the controller is configured to bias the dummy access line transistors to reduce an electric field and charge injection from the electric field into charge storage material of the select gate transistors.

23. A memory device, comprising:
a block of memory cells, wherein the block includes a plurality of data lines, a plurality of access lines, a source line, and a plurality of strings of series-coupled memory cells, wherein each string has a drain select gate transistor connected in series between the string and one of the data lines, and further has a source select gate transistor connected in series between the string and the source line;
a controller configured to:
erase the block of memory cells;
for each of the strings, after erasing the block and before subsequent programming of the block:
perform a threshold voltage test for the drain select gate transistor; and
perform a threshold voltage test for the source select gate transistor;
determine a number of bad strings in the block based on the test results; and
mark the block as a bad block if the determined number of bad strings exceeds a threshold.

24. The device of claim 23, wherein the threshold voltage tests are configured to determine if the drain select gate transistor is within a first prescribed range of voltages, and to determine if the source select gate transistor is within a second prescribed range of voltages.

25. A memory device, comprising:
a block of non-volatile memory cells, wherein the block includes a plurality of data lines, a plurality of access lines, a source line, and a plurality of NAND strings of series-coupled non-volatile memory cells, wherein each NAND string has a drain-side dummy access line transistor and a drain select gate transistor connected in series between the NAND string and one of the data lines, and each NAND string further has a source-side dummy access line transistor and a source select gate transistor connected in series between the NAND string and the source line; and
a controller configured to:
erase the block of non-volatile memory cells, wherein in erasing the block the controller is configured to bias the dummy access line transistors to reduce an electric field and charge injection from the electric field into the select gate transistors; and
after erasing the block and before subsequent programming of the block:
check a threshold voltage of each of the select gate transistors;
determine a number of the strings having a select gate transistor that has a threshold voltage outside of a prescribed range; and
retire the block from use if the number exceeds a threshold.

26. The device of claim 25, wherein each NAND string has two drain-side dummy access line transistors connected between the NAND string and the drain select gate transistor, and further has two source-side dummy access line transistors connected between the NAND string and the source select gate transistor.

27. The device of claim 26, wherein a controller being configured to check a threshold voltage of each of the select gate transistors comprises a controller being configured to check a threshold voltage of each of select gate transistors and the dummy access line transistors, and wherein a controller configured to determine a number of the strings comprises the controller being configured to determine a number of the strings having a select gate transistor or a dummy access line transistor that have a threshold voltage outside of a prescribed range.

28. The device of claim 27, wherein in checking the threshold voltage of a select gate transistor, the controller is configured to determine whether a threshold voltage of the select gate transistor is in a first prescribed range.

29. The device of claim 28, wherein in checking the threshold voltage of a dummy access line transistor, the controller is configured to determine whether the dummy access line transistor is in a second prescribed range.

* * * * *